United States Patent
Oda et al.

(10) Patent No.: US 9,202,795 B2
(45) Date of Patent: Dec. 1, 2015

(54) LAMINATED FILM AND USE THEREOF

(75) Inventors: Takashi Oda, Ibaraki (JP); Naohide Takamoto, Ibaraki (JP); Hiroyuki Senzai, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 110 days.

(21) Appl. No.: 13/530,068

(22) Filed: Jun. 21, 2012

(65) Prior Publication Data
US 2012/0326280 A1 Dec. 27, 2012

(30) Foreign Application Priority Data
Jun. 22, 2011 (JP) .................. 2011-138438

(51) Int. Cl.
*H01L 23/544* (2006.01)
*H01L 23/00* (2006.01)
(Continued)

(52) U.S. Cl.
CPC ............... *H01L 24/27* (2013.01); *C09J 7/0239* (2013.01); *H01L 24/29* (2013.01); *H01L 25/0657* (2013.01); *C09J 2201/36* (2013.01); *C09J 2201/606* (2013.01); *C09J 2201/61* (2013.01); *C09J 2203/326* (2013.01); *C09J 2433/00* (2013.01); *C09J 2461/00* (2013.01); *C09J 2463/00* (2013.01); *H01L 23/29* (2013.01); *H01L 23/3114* (2013.01); *H01L 24/13* (2013.01); *H01L 24/14* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/13111* (2013.01); *H01L 2224/13144* (2013.01); *H01L 2224/13147* (2013.01); *H01L 2224/1403* (2013.01); *H01L 2224/14181* (2013.01); *H01L 2224/16145* (2013.01); *H01L 2224/16148* (2013.01); *H01L 2224/16225* (2013.01); *H01L 2224/16245* (2013.01); *H01L 2224/27003* (2013.01); *H01L 2224/27334* (2013.01); *H01L 2224/32145* (2013.01); *H01L 2224/73104* (2013.01); *H01L 2224/8191* (2013.01); *H01L 2224/81193* (2013.01); *H01L 2224/83191* (2013.01); *H01L 2224/92125* (2013.01);
(Continued)

(58) Field of Classification Search
USPC .......................................................... 257/620
IPC ....................................................... H01L 23/29
See application file for complete search history.

(56) References Cited

U.S. PATENT DOCUMENTS 7,508,081 B2 * 3/2009 Matsumura et al. .......... 257/782
7,611,926 B2 * 11/2009 Takamoto et al. ............ 438/118
(Continued)

FOREIGN PATENT DOCUMENTS

JP 10289969 10/1998

*Primary Examiner* — Eugene Lee
(74) *Attorney, Agent, or Firm* — Alleman Hall McCoy Russell & Tuttle LLP (57) ABSTRACT

Provided is a laminated film wherein the space between semiconductor elements that are three-dimensionally mounted can be filled easily and securely. The laminated film of the present invention is a laminated film for filling the space between semiconductor elements that are electrically connected through a member or connection, the film including a dicing sheet in which a pressure-sensitive adhesive layer is laminated on a base material and a curable film that is laminated on the pressure-sensitive adhesive layer, wherein the curable film has a lowest melt viscosity at 50 to 200° C. of $1 \times 10^2$ Pa·s or more and $1 \times 10^4$ Pa·s or less.

3 Claims, 2 Drawing Sheets (51) Int. Cl.
  *H01L 25/065* (2006.01)
  *C09J 7/02* (2006.01)
  *H01L 23/29* (2006.01)
  *H01L 23/31* (2006.01)

(52) U.S. Cl.
  CPC ............... *H01L 2225/06513* (2013.01); *H01L 2225/06517* (2013.01); *H01L 2225/06541* (2013.01); *H01L 2225/06565* (2013.01); *H01L 2924/01029* (2013.01); *H01L 2924/15787* (2013.01); *Y10T 428/2826* (2015.01)

(56) References Cited

U.S. PATENT DOCUMENTS

| | | | |
|---|---|---|---|
| 8,034,667 B2* | 10/2011 | Shinoda et al. | 438/127 |
| 2007/0137782 A1* | 6/2007 | Matsumura et al. | 156/275.7 |
| 2008/0241995 A1* | 10/2008 | Fukui et al. | 438/109 |
| 2010/0055842 A1* | 3/2010 | Sugo et al. | 438/118 |
| 2010/0102446 A1* | 4/2010 | Katsurayama et al. | 257/738 |
| 2011/0084408 A1* | 4/2011 | Shishido et al. | 257/783 |
| 2011/0151195 A1* | 6/2011 | Mitsukura et al. | 428/156 |

* cited by examiner

LAMINATED FILM AND USE THEREOF

BACKGROUND OF THE INVENTION

1. Field of the Invention

The present invention relates to a laminated film and use thereof.

2. Description of the Related Art

In recent years, thinning and downsizing of a semiconductor device and its package have been further required. Because of that, a flip-chip type semiconductor device, in which a semiconductor element such as a semiconductor chip is mounted on a substrate by flip-chip bonding (flip-chip connected), has been widely used as a semiconductor device and its package. In the flip-chip connection, the circuit surface of a semiconductor chip is fixed to the electrode forming surface of the substrate in a way that the circuit surface is facing to the electrode forming surface. After the flip-chip connection, the space between the semiconductor element and the substrate is filled with a sealing resin in order to protect the surface of the semiconductor element and to secure connection reliance between the semiconductor element and the substrate. A liquid sealing resin has been widely used as such a sealing resin. However, it is difficult to adjust the filling position and the filling amount of the liquid sealing resin. Then, a technique has been proposed in which a sheet-like sealing resin is used to fill the space between the semiconductor element and the substrate (Japanese Patent Application Laid-Open No. 10-289969).

Further, a three-dimensional mounting technique, in which semiconductor elements are laminated in a plurality of layers in the thickness direction, has been developed for the purpose of high density integration of a semiconductor element. Examples of a semiconductor element that is used in the three-dimensional mounting technique include semiconductor elements that are referred to as TSV (Through Silicon Via) type semiconductor elements in which members for connection, such as bumps that are formed on both surfaces of the semiconductor element, are electrically connected through a via. The member for connection is formed in advance so that the position of the member for connection of the semiconductor element in the lower layer (substrate side) corresponds to the position of the member for connection of the semiconductor element in the upper layer, to perform the three-dimensional mounting more easily and securely.

SUMMARY OF THE INVENTION

When semiconductor elements are three-dimensionally mounted, the space between semiconductor elements is necessarily sealed with a resin in the same manner as in sealing the space between a semiconductor element and a substrate with a resin. However, when a liquid sealing resin is used to fill the space between semiconductor elements, it is more difficult to adjust the filling position and the filling amount compared to filling the space between a semiconductor element and a substrate, and when the filling amount becomes excessive, the resin flows out from the space between the semiconductor elements, and the resin attaches to the surface that is opposite to the filling space or attaches to the substrate. In the case of three-dimensional mounting using a sheet-like sealing resin, it is necessary not only to align the sheet-like sealing resin in the plane direction but also to align it in the height direction (lamination direction) upon pasting the sheet-like sealing resin to the surface of the semiconductor element. As a result, the manufacturing process of the semiconductor device becomes complicated and it becomes difficult to improve the efficiency. In addition, unlike a liquid sealing resin, the space may not be filled sufficiently with the sheet sealing resin because the degree of filling the space between the semiconductor elements cannot be adjusted after the semiconductor elements are laminated.

An object of the present invention is to provide a laminated film which can easily and securely fill the space between semiconductor elements that are three-dimensionally mounted.

As a result of devoted investigation, the present inventors have found that the objective can be achieved by adopting the following configuration, and the present invention has been completed.

That is, in order to solve the above-described problems, the laminated film of the present invention is a laminated film for filling a space between semiconductor elements that are electrically connected through a member for connection, the film including a dicing sheet in which a pressure-sensitive adhesive layer is laminated on a base material and a curable film that is laminated on the pressure-sensitive adhesive layer, wherein the curable film has a lowest melt viscosity at 50 to 200° C. of $1 \times 10^2$ Pa·s or more and $1 \times 10^4$ Pa·s or less.

In the laminated film of the present invention, the curable film is allowed to have a lowest melt viscosity at 50 to 200° C. of $1 \times 10^2$ Pa·s or more and $1 \times 10^4$ Pa·s or less. Accordingly, the member for connection can easily enter into the curable film. The generation of voids between the curable films can be prevented when the semiconductor elements are electrically connected, and the curable film can be prevented from protruding from the space between the semiconductor elements. The lowest melt viscosity can be measured with a procedure described in subsequent examples.

In the laminated film, the curable film is preferably composed of an adhesive composition containing an epoxy resin and a phenolic resin. The adhesive composition more preferably contains an acrylic copolymer. When the curable film includes such materials, the lowest melt viscosity of the curable film can be easily adjusted.

The present invention encompasses use of the laminated film for filling a space between semiconductor elements that are electrically connected through a member for connection, wherein a surface of a semiconductor wafer where a member for connection is formed and a curable film of the laminated film are pasted together; the semiconductor wafer is diced to form semiconductor elements; a laminated body of the curable film and the semiconductor is picked up from the dicing sheet; the laminated bodies are electrically connected through the member for connection and the curable films are bonded to fill the space between the semiconductor elements with the curable film; and the height X (μm) of the member for connection and the thickness Y (μm) of the curable film satisfy the following relationship:

$$1.0 \le Y/X \le 1.7.$$

That is to say, a ratio Y:X of the thickness Y (μm) of the curable film to the height X (μm) of the member for connection is preferably within a range of 1.0 to 1.7.

With the use of the laminated film, the space between the semiconductor elements can be filled without generating voids between the curable films and without generating a protrusion of the curable film from the space between the semiconductor elements.

DETAILED DESCRIPTION OF PREFERRED EMBODIMENTS (Laminated Film)

A laminated film is described below that is used in a method of manufacturing a semiconductor device according to the present embodiment.

Figure 1:
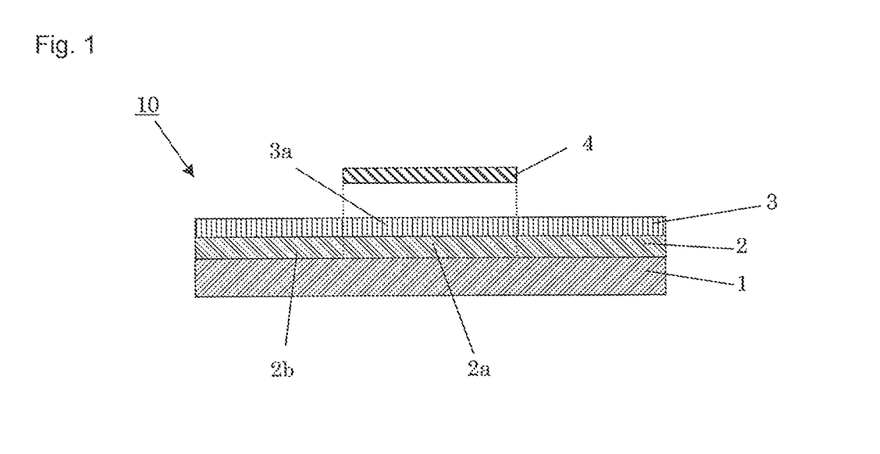
FIG. 1 is a schematic sectional view showing a laminated film according to one embodiment of the present invention.
Figure 2:
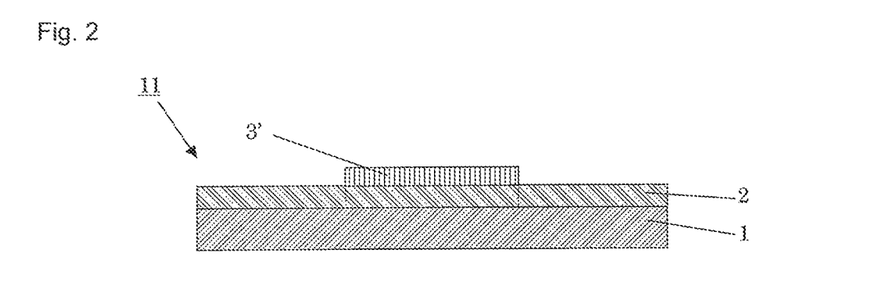
FIG. 2 is a schematic sectional view showing a laminated film according to another embodiment of the present invention.

As shown in FIG. 1, a laminated film 10 includes a dicing sheet in which a pressure-sensitive adhesive layer 2 is laminated on a base material 1 and a curable film 3 that is laminated on the pressure-sensitive adhesive layer 2. As shown in FIG. 2, it may have a configuration in which a curable film 3' is formed only on a pasting portion of a semiconductor wafer 4. The curable film 3 and the curable film 3' correspond to a curable film in the present specification.

(Dicing Sheet)

The dicing sheet includes the base material 1 and the pressure-sensitive adhesive layer 2 that is laminated on the base material.

(Base Material)

The base material 1 serves as a strong base of the laminated films 10 and 11. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth) acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper. When the pressure-sensitive adhesive layer 2 is of a radiation curing type, a base material having radiation transmissivity is preferably adopted as the base material 1.

An example of a material of the base material 1 is a polymer such as a cross-linked body of the resins described above. The plastic films may be used in a non-stretched state or may be used in a uniaxially or biaxially stretched state as necessary. With a resin sheet to which a heat shrinking property is imparted by a stretching treatment or the like, the adhering area of the pressure-sensitive adhesive layer 2 to the curable films 3 and 3' can be reduced by heat-shrinking the base material 1 after dicing, and the semiconductor chips can be collected easily.

A known surface treatment such as a chemical or physical treatment such as a chromate treatment, ozone exposure, flame exposure, high voltage electric exposure, or an ionized ultraviolet treatment, and a coating treatment by an undercoating agent (for example, a tacky substance described later) can be performed on the surface of the base material 1 in order to improve adhesiveness, holding properties, etc., with the adjacent layer.

The same type or different type of base material can be appropriately selected and used as the base material 1, and a base material in which a plurality of types are blended can be used depending on the application. Further, a vapor-deposited layer of a conductive substance composed of a metal, an alloy, an oxide thereof, etc., and having a thickness of about 30 to 500 angstroms can be provided on the base material 1 in order to give an antistatic function to the base material 1. The base material 1 may be a single layer or a multilayer of two or more types.

The thickness of the base material 1 can be appropriately decided without limitation particularly. However, it is generally about 5 to 200 μm.

(Pressure-Sensitive Adhesive Layer)

The pressure-sensitive adhesive used for the formation of the pressure-sensitive adhesive layer is not especially limited, and general pressure-sensitive adhesives such as an acrylic pressure-sensitive adhesive and a rubber pressure-sensitive adhesive can be used. An acrylic pressure-sensitive adhesive containing an acrylic polymer as a base polymer is preferable as the pressure-sensitive adhesive from the viewpoint of cleaning and washing properties of an electronic part such as a semiconductor wafer or a glass part such that contamination may be removed with ultrapure water or an organic solvent such as alcohol.

An example of the acrylic polymer is a polymer containing an acrylic ester as a main monomer component. Specific examples of the acrylic ester include an acrylic polymer in which an acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methyl ester, ethyl ester, propyl ester, isopropyl ester, butyl ester, isobutyl ester, sec-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester) and cycloalkyl acrylate (for example, cyclopentyl ester, cyclohexyl ester, etc.). These monomers may be used alone or two or more types may be used in combination. (Meth)acrylic acid refers to an acrylic acid and/ or a methacrylic acid, and hereinafter, every occurrence of (meth) in the present application has the same meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance, or some other property of the polymer. Examples of such a monomer component include carboxyl-containing monomers such as acrylic acid, methacrylic acid, carboxyethyl(meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer (s) to be used is preferably 40% by weight or less of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy(meth)acrylate, polyester(meth)acrylate, urethane (meth)acrylate etc. These multifunctional monomers can also be used as a mixture of one or more thereof. From the viewpoint of adhesiveness, etc., the amount of the multifunctional monomer used is preferably 30 wt % or less based on the whole monomer components.

Preparation of the above acryl polymer can be performed by applying an appropriate polymerization mechanism, such as solution polymerization, emulsion polymerization, bulk polymerization, and suspension polymerization to a mixture of one or two or more kinds of component monomers, for example. Since the pressure-sensitive adhesive layer preferably has a composition in which the content of low molecular weight materials is suppressed from the viewpoint of prevention of wafer contamination, and since those in which an acrylic polymer having a weight-average molecular weight of 300000 g/mol or more, particularly 400000 to 30000000 g/mol, are as a main component preferable from such viewpoint, the pressure-sensitive adhesive can be made to be an appropriate cross-linking type with an internal cross-linking manner, an external cross-linking manner, etc.

An external crosslinking agent can be appropriately adopted in the pressure-sensitive adhesive to increase the weight-average molecular weight of the acrylic polymer, or the like that constitutes the base polymer. Specific examples of an external crosslinking method include a method of adding a so-called crosslinking agent such as a polyisocyanate compound, an epoxy compound, an aziridine compound, or a melamine crosslinking agent and carrying out the cross-linking reaction to form the cross-linked product. The amount of external crosslinking agent used is determined by a ratio to the amount of base polymer to be crosslinked and further by the pressure-sensitive adhesive application. Generally, the amount of external crosslinking agent used is about 5 parts by weight or less, and preferably 0.1 to 5 parts by weight to 100 parts by weight of the base polymer. Further, conventionally known various additives such as a tackifier and an antioxidant may be used in the pressure-sensitive adhesive other than the above-described components as necessary.

The pressure-sensitive adhesive layer 2 can be formed with a radiation curable pressure-sensitive adhesive. The adhesive strength of the radiation curable pressure-sensitive adhesive layer 2 can be reduced easily by increasing the degree of crosslinking by irradiation (irradiation by an ultraviolet ray, electron ray, X ray, or the like), and a difference in the adhesive strength with the portion 2b may be created by irradiating with an ultraviolet ray only the portion 2a that corresponds to the semiconductor wafer pasting portion of the pressure-sensitive adhesive layer 2 shown in FIG. 2, in a case that the pressure-sensitive adhesive layer 2 is formed with a radiation curable pressure-sensitive adhesive.

The portion 2a where the adhesive strength is remarkably reduced can be easily formed by curing the radiation curable pressure-sensitive adhesive layer 2 in accordance with the curable film 3' shown in FIG. 2. Because the curable film 3' is pasted onto the portion 2a where the adhesive strength is reduced by curing, the interface between the portion 2a in the pressure-sensitive adhesive layer 2 and the curable film 3' has a characteristic of peeling easily during pickup. On the other hand, the portion that is not irradiated with radiation has sufficient adhesive strength and forms the portion 2b.

As described above, the portion 2b that is formed with an uncured radiation curable pressure-sensitive adhesive adheres to the curable film 3, and maintains adhesion to the curable film 3 during dicing in the pressure-sensitive adhesive layer 2 of the laminated film 10 shown in FIG. 1. In this manner, the pressure-sensitive adhesive can support the curable film 3 for fixing the semiconductor chip (the semiconductor chip and the like) onto an adherend such as a substrate with a good balance of adhesion and peeling properties. In the pressure-sensitive adhesive layer 2 of the laminated film 11 shown in FIG. 2, the portion 2b can fix a wafer ring.

As the radiation curable pressure-sensitive adhesive, those having a radiation curable functional group such as a carbon-carbon double bond and having adherability can be used without particular limitation. An example of the radiation curable pressure-sensitive adhesive is an adding-type radiation curable pressure-sensitive adhesive in which a radiation curable monomer or oligomer component is incorporated into a general pressure-sensitive adhesive such as the acrylic pressure-sensitive adhesive or the rubber pressure-sensitive adhesive.

Examples of the radiation curable monomer component to be compounded include a urethane oligomer, urethane(meth) acrylate, trimethylolpropane tri(meth)acrylate, tetramethylolmethane tetra(meth)acrylate, pentaerythritol tri(meth) acrylate, pentaerythritol tetra(meth)acrylate, dipentaerythritol monohydroxypenta(meth)acrylate, dipentaerythritol hexa(meth)acrylate, and 1,4-butane dioldi(meth) acrylate. Further, the radiation curable oligomer component includes various types of oligomers such as a urethane based, a polyether based, a polyester based, a polycarbonate based, and a polybutadiene based oligomer, having a molecular weight is appropriately in a range of about 100 to 30,000 g/mol. The compounding amount of the radiation curable monomer component and the oligomer component can be appropriately determined to an amount in which the adhesive strength of the pressure-sensitive adhesive layer can be decreased depending on the type of the pressure-sensitive adhesive layer. Generally, it is, for example, 5 to 500 parts by weight, and preferably about 40 to 150 parts by weight based on 100 parts by weight of the base polymer such as an acrylic polymer constituting the pressure sensitive adhesive.

Further, besides the adding-type radiation curable pressure-sensitive adhesive described above, the radiation curable pressure-sensitive adhesive includes an internal radiation curable pressure-sensitive adhesive using an acrylic polymer having a radical reactive carbon-carbon double bond in the polymer side chain, in the main chain, or at the end of the main chain as the base polymer. The internal radiation curable pressure-sensitive adhesives of an internally provided type are preferable because they do not have to contain the oligomer component, etc., that is a low molecular weight component, or most of them do not contain the oligomer component, etc., and they can form a pressure-sensitive adhesive layer having a stable layer structure without migrating the oligomer component, etc., in the pressure sensitive adhesive over time.

The above-mentioned base polymer, which has a carbon-carbon double bond, may be any viscous polymer that has a carbon-carbon double bond. As such, a base polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier from a molecule design perspective. The method is, for example, a method of copolymerizing a monomer having a first functional group with an acrylic polymer, and then causing the resultant to condensation-react or addition-react with a compound having a second functional group reactive with the above-mentioned first functional group and a carbon-carbon double bond while keeping the radiation curability of the carbon-carbon double bond.

Examples of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The internal radiation curable pressure-sensitive adhesive may be made only of the above-mentioned base polymer (in particular, the acrylic polymer), which has a carbon-carbon double bond. However, the above-mentioned radiation curable monomer component or oligomer component may be incorporated into the base polymer to such an extent that properties of the adhesive are not deteriorated. The amount of the radiation curable oligomer component or the like is usually 30 parts by weight or less, preferably from 0 to 10 parts by weight for 100 parts by weight of the base polymer.

The radiation curable pressure-sensitive adhesive preferably contains a photopolymerization initiator in the case of curing it with an ultraviolet ray or the like. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation curable pressure-sensitive adhesive which is used in the formation of the pressure-sensitive adhesive layer 2 include a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include a polyvalent alcohol ester or an oligoester of acryl acid or methacrylic acid and an epoxy or a urethane compound.

The radiation curable pressure-sensitive adhesive layer 2 can contain a compound that is colored by radiation irradiation as necessary. By containing the compound that is colored by radiation irradiation in the pressure-sensitive adhesive layer 2, only a portion irradiated with radiation can be colored. That is, the portion 2a that corresponds to the semiconductor wafer pasting portion 3a shown in FIG. 1 can be colored. Therefore, whether the pressure-sensitive adhesive layer 2 is irradiated with radiation or not can be visually determined right away, and the semiconductor wafer pasting portion 3a can be recognized easily, and the pasting of the semiconductor wafer is easy. Further, when detecting a semiconductor element with a photosensor or the like, the detection accuracy improves, and no false operation occurs during pickup of the semiconductor element.

The compound that colors by radiation irradiation is colorless or has a pale color before the irradiation. However, it is colored by irradiation with radiation. A preferred specific example of the compound is a leuco dye. Common leuco dyes such as triphenylmethane, fluoran, phenothiazine, auramine, and spiropyran dyes can be preferably used. Specific examples thereof include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenylmethanol, and 4,4',4"-trisdimethylaminotriphenylmethane.

Examples of a developer that is preferably used with these leuco dyes include a prepolymer of a conventionally known phenolformalin resin, an aromatic carboxylic acid derivative, and an electron acceptor such as activated white earth, and various color developers can be used in combination for changing the color tone.

The compound that colors by irradiation with radiation may be included in the radiation curable pressure-sensitive adhesive after being dissolved in an organic solvent or the like, or may be included in the pressure-sensitive adhesive in the form of a fine powder. The ratio of use of this compound is 10% by weight or less, preferably 0.01 to 10% by weight, and more preferably 0.5 to 5% by weight in the pressure-sensitive adhesive layer 2. When the ratio of the compound exceeds 10% by weight, the curing of the portion 2a of the pressure-sensitive adhesive layer 2 becomes insufficient because the radiation onto the pressure-sensitive adhesive layer 2 is absorbed too much by this compound, and the adhesive strength may not reduce sufficiently. On the other hand, the ratio of the compound is preferably 0.01% by weight or more to color the compound sufficiently.

In the pressure-sensitive adhesive layer 2, part of the pressure-sensitive adhesive layer 2 may be irradiated with radiation so that the adhesive strength of the portion 2a in the pressure-sensitive adhesive layer 2 becomes less than the adhesive strength of the portion 2b.

An example of the method of forming the portion 2a on the pressure-sensitive adhesive layer 2 is a method of forming the pressure-sensitive adhesive layer 2 on the base material 1 and then curing the layer by irradiating the portion 2a partially with radiation. The partial irradiation with radiation can be performed through a photo mask that has a pattern corresponding to the portion 3b or the like other than the semiconductor wafer pasting portion 3a. Another example is a method of spot curing the layer by irradiation with an ultraviolet ray. The formation of the pressure-sensitive adhesive layer 2 can be performed by transferring a layer provided on a separator onto the base material 1. The partial radiation curing can also be performed on the pressure-sensitive adhesive layer 2 that is provided on the separator.

Further, the portion 2a having a reduced adhesive strength can be formed by using at least one surface of the base material 1 where the whole or part of the portion other than the portion corresponding to the semiconductor wafer pasting portion 3a is protected from light, forming the pressure-sensitive adhesive layer 2 on this surface, and curing the portion corresponding to the semiconductor wafer pasting portion 3a by irradiation with radiation. As a light-shielding material, a material that is capable of serving as a photo mask on a supporting film can be produced by printing, vapor deposition, or the like. According to such a manufacturing method, the laminated film 10 of the present invention can be efficiently manufactured.

When curing is inhibited due to oxygen during irradiation with radiation, it is desirable to shield oxygen (air) from the surface of the pressure-sensitive adhesive layer 2 in some way. Examples of the method include a method of covering the surface of the pressure-sensitive adhesive layer 2 with a separator and a method of performing irradiation with an ultraviolet ray or the like in a nitrogen gas atmosphere.

The thickness of the pressure-sensitive adhesive layer 2 is not especially limited. However, it is preferably about 10 to 100 μm from the viewpoint of preventing cracking on the cut surface of the chip and maintaining the fixation of the curable film. It is more preferably 15 to 80 μm, and further preferably 20 to 50 μm.

(Curable Film)

The curable films 3 and 3' can be used as a film for sealing that fills the space between semiconductor elements. As the constituents of the curable film, a thermoplastic resin and a thermosetting resin may be used together, or a thermoplastic resin or a thermosetting resin may be used alone.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any special kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any special kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methyl acrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth) acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

Regarding the blend ratio between the epoxy resin and the phenol resin, for example, the phenol resin is blended with the epoxy resin in such a manner that the hydroxyl groups in the phenol resin are preferably from 0.5 to 2.0 equivalents, more preferably from 0.8 to 1.2 equivalents per equivalent of the epoxy groups in the epoxy resin component. If the blend ratio between the two is out of the range, the curing reaction therebetween does not advance sufficiently so that properties of the cured epoxy resin easily deteriorate.

In the present invention, a curable film comprising the epoxy resin, the phenol resin, and an acrylic resin is particularly preferable. Since these resins contain ionic impurities in only a small amount and have high heat resistance, the reliability of the semiconductor element can be ensured. Regarding the blend ratio in this case, the amount of the mixture of the epoxy resin and the phenol resin is from 10 to 200 parts by weight for 100 parts by weight of the acrylic resin component.

The thermal curing accelerator catalyst for the epoxy resin and the phenol resin is not especially limited, and it is appropriately selected from known thermal curing accelerator catalysts. The thermal curing accelerator catalyst can be used alone or two types or more of them can be used in combination. Examples of the thermal curing accelerator catalyst that can be used include an amine curing accelerator, a phosphorus curing accelerator, an imidazole curing accelerator, a boron curing accelerator, and a phosphorus-boron curing accelerator.

The curable films 3 and 3' may be colored as necessary in the present invention. The color that is provided to the curable films 3 and 3' by coloring is not especially limited, and preferred examples thereof include black, blue, red, and green. For coloring, a colorant to be used can be appropriately selected from known colorants such as pigments and dyes.

In order to crosslink the curable film 3, 3' of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 parts by weight, the cohesive force is unfavorably insufficient. A different polyfunctional compound, such as an epoxy resin, together with the polyisocyanate compound may be incorporated if necessary.

Further, an inorganic filler can be appropriately incorporated into the curable films 3 and 3'. By incorporation of the inorganic filler, electric conductivity may be given, thermal conductivity may be improved, and the storage modulus may be adjusted.

Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used.

The average particle size of the inorganic filler is preferably within a range of 0.1 to 5 μm, and more preferably within a range of 0.2 to 3 μm. When the average particle size of the inorganic filler is less than 0.1 μm, it becomes difficult to make Ra of the curable film be 0.15 μm or more. On the other hand, when the average particle size exceeds 5 it becomes difficult to make Ra less than 1 μm. In the present invention, two or more types of inorganic fillers having a different average particle size may be used in combination. The value of the average particle size is obtained using a luminous intensity type particle size distribution meter (manufactured by HORIBA, Ltd., device name: LA-910).

The incorporation amount of the inorganic filler is preferably set to 20 to 80 parts by weight to 100 parts by weight of the organic resin component. It is especially preferably 20 to 70 parts by weight. When the incorporation amount of the inorganic filler is less than 20 parts by weight, heat resistance deteriorates. Therefore, the curable films 3 and 3' cure when they are exposed to a thermal history of high temperature for a long time, and fluidity and the embedding property may deteriorate. When it exceeds 80 parts by weight, the storage modulus of the curable films 3 and 3' becomes large. Accordingly, it becomes difficult for the cured adhesive to relax the stress, and the embedding property for bumps may deteriorate in a pasting step.

If necessary, other additives besides the inorganic filler may be incorporated into the curable film 3, 3' of the present invention. Examples thereof include a flame retardant, a silane coupling agent, and an ion trapping agent. Examples of the flame retardant include antimony trioxide, antimony pentaoxide, and brominated epoxy resin. These may be used alone or in combination of two or more thereof. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof. Examples of the ion trapping agent include hydrotalcite and bismuth hydroxide. These may be used alone or in combination of two or more thereof.

The curable film has a lowest melt viscosity at 50 to 200° C. of $1 \times 10^2$ Pa·s or more and $1 \times 10^4$ Pa·s or less. Because the curable film specifically has such a low melt viscosity, the member for connection can easily penetrate into the curable film. The generation of voids between the curable films can be prevented when the semiconductor elements are electrically connected, and the curable film can be prevented from protruding from the space between the semiconductor elements.

The thickness of each of the curable films 3 and 3' (total thickness in the case of a plurality of layers) is not especially limited. However, the thickness of curable films 3 and 3' is preferably 5 μm or more and 250 μm or less considering the strength of the curable film and the filling properties of the space between the semiconductor elements. The thickness of each of the curable films 3 and 3' can be appropriately set in consideration of the height of the member for connection.

The curable films 3, 3' of the laminated films 10, 11 are preferably protected by a separator (not shown). The separator has a function as a protecting material that protects the curable films 3, 3' until they are practically used. Further, the separator can be used as a supporting base material when transferring the curable films 3, 3' to the pressure-sensitive adhesive layer 2. The separator is peeled when pasting a workpiece onto the curable films 3, 3' of the laminated film. Polyethylenetelephthalate (PET), polyethylene, polypropylene, plastic film, paper, etc., whose surface is coated with a peeling agent such as a fluorine based peeling agent and a long chain alkylacrylate based peeling agent can be also used as the separator.

(Method of Manufacturing Laminated Film)

A method of manufacturing the laminated film according to the present embodiment includes the steps of forming the pressure-sensitive adhesive layer 2 on the base material 1, and forming the curable film 3 on the pressure-sensitive adhesive layer 2.

Examples of a method of forming the base material 1 include a calender film forming method, a casting method in an organic solvent, an inflation extrusion method in a closed system, a T die extrusion method, a coextrusion method, and a dry lamination method.

The pressure-sensitive adhesive layer 2 can be formed by applying a solution of a pressure-sensitive adhesive composition onto the base material 1 and drying the solution under a prescribed condition (heat cross-linking the solution as necessary). The application method is not especially limited, and examples thereof include roll coating, screen coating, and gravure coating. The application thickness is appropriately set so that the thickness of the pressure-sensitive adhesive layer 2 that can be eventually obtained by drying the coating layer falls within a range of 10 to 100 μm. The viscosity of the pressure-sensitive adhesive composition solution is not especially limited. However, it is preferably 100 to 5000 mPa·s, and more preferably 200 to 3000 mPa·s at 25° C.

The method of drying the coating layer is not especially limited. However, it is preferably dried without using a dry wind when forming a pressure-sensitive adhesive layer having a flat surface, for example. The drying time can be appropriately set according to the application amount of the pressure-sensitive adhesive composition solution; it is normally within a range of 0.5 to 5 min, and preferably within a range of 2 to 4 min. The drying temperature is not especially limited; it is normally 80 to 150° C., and preferably 80 to 130° C.

The pressure-sensitive adhesive layer 2 may be formed by forming a coating film of a pressure-sensitive adhesive composition by application on a separator, and then drying the coating film under the above-described drying condition. Then, the pressure-sensitive adhesive layer 2 is transferred onto the base material.

An example of the step of forming the curable film 3 is a method of performing the steps of forming a coating layer by applying an adhesive composition solution, which is a constituent material of the curable film, onto a releasing film and then drying the coating layer.

The method of applying the adhesive composition solution is not especially limited. However, an example is a method of applying the solution using a comma coating method, a fountain method, a gravure method, or the like. The application thickness is appropriately set so that the thickness of the curable film that can be eventually obtained by drying the coating layer falls within a range of 5 to 250 μm. The viscosity of the adhesive composition solution is not especially limited. However, it is preferably 400 to 2500 mPa·s, and more preferably 800 to 2000 mPa·s at 25° C.

The releasing film is not especially limited. However, an example thereof is a film in which a release coating layer such as a silicone layer is formed on the surface of the releasing film which is pasted onto the curable film on the base material. Examples of the base material of the releasing film include paper such as glassine paper and a resin film made of polyethylene, polypropylene, or polyester.

The drying of the coating layer is performed by blowing a dry wind over the coating layer. Examples of the method of blowing a dry wind include a method of blowing a dry wind so that the direction of blowing becomes parallel to the direction of transporting the releasing film and a method of blowing a dry wind so that the direction of blowing becomes perpendicular to the surface of the coating layer. The flow of the dry wind is not especially limited, and it is normally 5 to 20 m/min, and preferably 5 to 15 m/min. With the flow of the dry wind being 5 m/min or more, the drying of the coating layer is prevented from becoming insufficient. On the other hand, with the flow of the dry wind being 20 m/min or less, the concentration of the organic solvent in the vicinity of the surface of the coating layer becomes uniform, and therefore, evaporation of the solvent can be made uniform. As a result, a curable film having a uniform surface can be formed.

The drying time is appropriately set according to the applied thickness of the adhesive composition solution; it is normally within a range of 1 to 5 min, and preferably within a range of 2 to 4 min. When the drying time is less than 1 min, the curing reaction does not proceed sufficiently, and the amount of unreacted curing component and the amount of the remained solvent becomes large. Accordingly, problems of outgassing and voids may occur in the subsequent steps. On the other hand, when the drying time exceeds 5 min, the curing reaction proceeds too far. As a result, fluidity and the embedding property of the bumps of the semiconductor wafer may deteriorate.

The drying temperature is not especially limited, and it is normally set within a range of 70 to 160° C. However, the drying temperature is preferably increased stepwise with the passage of the drying time in the present invention. Specifically, it is set within a range of 70 to 100° C. at an initial stage of the drying (1 min or less immediately after the start of the drying), and it is set within a range of 100 to 160° C. at a late stage of the drying (more than 1 min to 5 min or less) for example. Accordingly, pinholes on the surface of the coating layer that are generated when the drying temperature is rapidly increased right after the start of the coating can be prevented.

Next, the curable film 3 is transferred onto the pressure-sensitive adhesive layer 2. The transfer is performed by pressure bonding. The pasting temperature is 30 to 50° C., and preferably 35 to 45° C. The pasting pressure is 0.1 to 0.6 MPa, and preferably 0.2 to 0.5 MPa.

The releasing film may be peeled after the curable film 3 is pasted onto the pressure-sensitive adhesive layer 2 or it may be used as a protective film of the laminated film as is and then peeled when the curable film is pasted onto the semiconductor wafer. Accordingly, the laminated film according to the present embodiment can be manufactured.

(Semiconductor Device)

Figure 3:
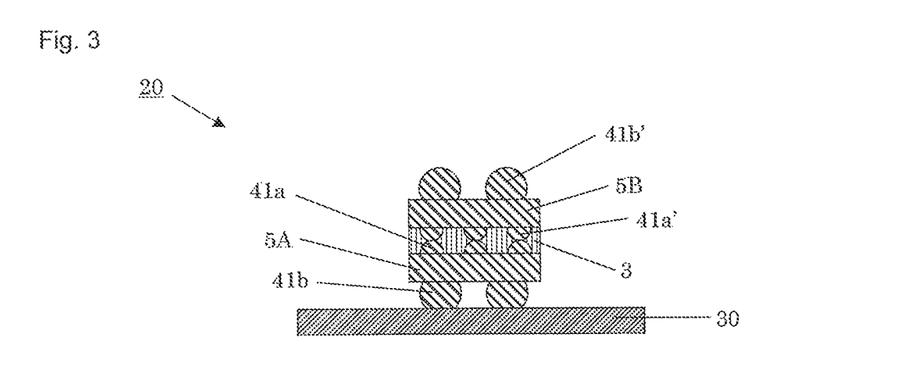
FIG. 3 is a schematic sectional view showing a semiconductor device according to one embodiment of the present invention.

A semiconductor device that is obtained using the laminated film will be described with reference to the drawings. FIG. 3 is a schematic sectional view showing a semiconductor device according to one embodiment of the present invention. In a semiconductor device 20 according to the present embodiment, a semiconductor element 5A having a bump (member for connection) 41a on one surface and a bump 41b on the other surface, and a semiconductor element 5B having the same configuration as the semiconductor element 5A are electrically connected to each other through bumps 41a and 41a'. The semiconductor element 5A is electrically connected to a substrate (adherend) 30 through the bump 41b. Therefore, two semiconductor elements 5A and 5B are electrically connected in order through the bumps on the substrate 30 as an adherend in the semiconductor device 20. A curable film 3 is arranged between the semiconductor element 5A and the semiconductor element 5B so as to fill the space therebetween. As seen from the following description of a method of manufacturing a semiconductor device, the curable film 3 is a member that is formed by bonding or attaching a curable film that is pasted to the surface where the bump 41a of the semiconductor element 5A is formed and a curable film that is pasted to the surface where the bump 41a' of the semiconductor element 5B is formed to each other. Not shown in the drawings, the space between the substrate 30 and the semiconductor element 5A may be filled with a curable film, other sealing resins, or the like.

The curable film 3 of the semiconductor device 20 may be cured or may not be cured. However, a curable film is used which has a lowest melt viscosity at 50 to 200° C. of $1\times10^2$ Pa·s or more and $1\times10^4$ Pa·s or less. Because the curable film having such a low melt viscosity is used, the member for connection such as a bump can easily enter into the curable film to improve the productivity, and at the same time, the generation of voids between the curable films can be prevented when the semiconductor elements are electrically connected, and the curable film can be effectively prevented from protruding from the space between the semiconductor elements. The detail of each member will be described in the following section of a method of manufacturing a semiconductor device.

(Method of Manufacturing Semiconductor Device)

Next, the method of manufacturing a semiconductor device using the laminated film of the present invention will be described below. With the method of manufacturing a semiconductor device, a flip-chip three-dimensionally mounted semiconductor device can be effectively manufactured using the above-described laminated film. FIGS. 4A to 4E are schematic sectional views showing steps of manufacturing a semiconductor device in which semiconductor chips are three-dimensionally mounted.

As the method of manufacturing a semiconductor device, it is preferably adopted a method of manufacturing a semiconductor device that includes the steps of: preparing a semiconductor wafer in which a plurality of members for connection are formed on both surfaces; preparing a laminated film including a dicing sheet in which a pressure-sensitive adhesive layer is laminated on a base material, and a curable film that is laminated on the pressure-sensitive adhesive layer and has a thickness more than the height of the member for connection on the first surface of the semiconductor wafer; pasting the curable film of the laminated film to the semiconductor wafer while facing the curable film to the first surface of the semiconductor wafer so that the members for connection are not exposed to the pressure-sensitive adhesive layer from the curable film; and dicing the semiconductor wafer to form a semiconductor element.

The manufacturing method further includes the steps of: irradiating the pressure-sensitive adhesive layer with an ultraviolet ray to cause the pressure-sensitive adhesive layer to be cured, thereby peeling off a laminated body A of the semiconductor element and the curable film; flip-chip connecting the semiconductor element of the laminated body A to an adherend; and electrically connecting the laminated body A and a laminated body B that differs from the laminated body A in a way that the first surfaces of both semiconductor elements are facing to each other.

[Step of Preparing Semiconductor Wafer]

A plurality of members for connection 41a and 41b, which may be in the form of bumps, may be formed on both surfaces 4a and 4b of the semiconductor wafer 4 (see FIG. 4A), or alternatively the members for connection may be formed only on either a first surface 4a or a second surface 4b of the semiconductor wafer 4 (not shown). A material of the member for connection such as a bump or a conductive material is not especially limited, and examples thereof include solders (alloys) such as a tin-lead-based metal material, a tin-silver-based metal material, a tin-silver-copper-based metal material, a tin-zinc-based metal material, and a tin-zinc-bismuth-based metal material, gold-based metal materials, and copper-based metal materials. The height of the member for connection can be determined depending on its use, and it is generally about 5 to 100 μm. Naturally, the height of each member for connection on the first surface 4a and the second surface 4b of the semiconductor wafer 4 may be the same or may differ.

The members for connection of both surfaces of the semiconductor wafer may be or may not be electrically connected. Example of the electric connection of the members for connection includes a connection through a via of TSV type and the like.

[Step of Preparing Laminated Film]

The laminated films shown in FIGS. 1 and 2 can be suitably used as the laminated film used in the method of manufacturing a semiconductor device. The laminated films 10 and 11 are used by appropriately peeling off separators that are optionally formed on the curable films 3 and 3'.

When the above-described laminated film is used in the method of manufacturing a semiconductor device according to the present embodiment, the height X (μm) of the member for connection that is formed on the surface of the semiconductor wafer and the thickness Y (μm) of the curable film preferably satisfy the following relationship:

$$1.0 \leq Y/X \leq 1.7.$$

That is to say, a ratio Y:X of the thickness Y (μm) of the curable film to the height X (μm) of the member for connection is preferably within a range of 1.0 to 1.7.

When the height X (μm) of the member for connection and the thickness Y (μm) of the curable film satisfy the above-described relationship, the space between the semiconductor elements can be sufficiently filled, and at the same time, the curable film can be prevented from excessively protruding from the space, and contamination of the semiconductor element by the curable film, and the like can be prevented. When the height of each member for connection differs on the first surface, the height of the highest member for connection is used as a standard.

[Mounting Step]

Figure 4A:
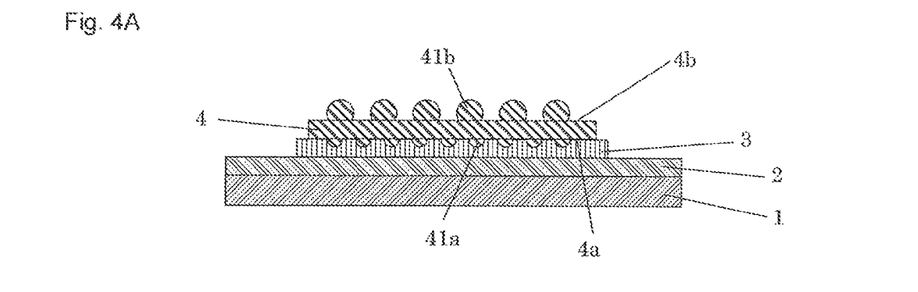
FIGS. 4A to 4E are schematic sectional views showing steps of manufacturing a semiconductor device in which semiconductor chips are three-dimensionally mounted.

As shown in FIG. 4A, first, a separator that is optionally formed on the curable film 3 of the laminated film is appropriately peeled off, and the curable film 3 of the laminated film and the first surface 4a of the semiconductor wafer 4 are allowed to face to each other to paste the curable film 3 to the semiconductor wafer 4 in a way that the member for connection 41a is not exposed to the pressure-sensitive adhesive layer 2 from the curable film 3 (mounting step). Because the curable film 3 has a thickness that is more than the height of the member for connection 41a on the first surface 4a of the semiconductor wafer 4, the member for connection 41a can be prevented from being exposed to the pressure-sensitive adhesive layer 2 from the curable film 3 without using a complicated procedure. As described above, because the member for connection of the semiconductor wafer remains within the curable film, the space between the semiconductor elements can be sufficiently filled even when connecting the laminated bodies that are diced later. At this time, the curable film is non-cured or semi-cured (e.g., the curing reaction in the curable film is not completed even though it has proceeded to a certain degree).

The pasting method is not especially limited. However, a method comprising performing a press fitting is preferable. The press fitting is normally performed by pressing with a pressing means such as a press fitting roll.

[Dicing Step]

Figure 4B:
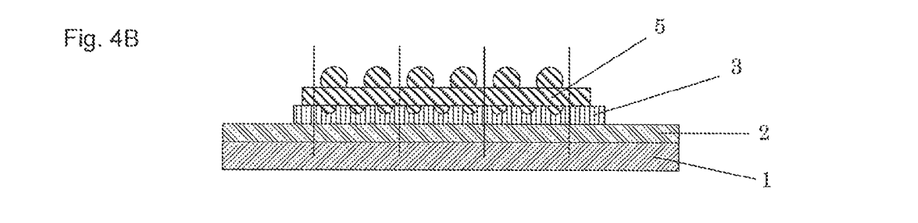

Next, the dicing of the semiconductor wafer is performed as shown in FIG. 4B. Accordingly, the semiconductor wafer 4 is cut and made into individualized pieces (made into small pieces) having a prescribed size to manufacture a semiconductor chip (semiconductor element) 5. The dicing is performed in accordance with a normal method from the surface opposite to the surface where the second surface 4b of the semiconductor wafer 4 that is the surface to which the curable film 3 is pasted. Because the member for connection 41b is also formed on the second surface 4b in the semiconductor element 5, the cut position for dicing can be easily aligned using the member for connection 41b as a mark. The cut position can be aligned by image recognition using an infrared (IR) ray.

In this step, a cutting method referred to as a full-cut method of cutting the wafer to the laminated film can be adopted, for example. The dicing apparatus that is used in this step is not especially limited, and a conventionally known apparatus can be used. Further, because the semiconductor wafer is adhered and fixed with excellent adhesion by the laminated film having a curable film, chip cracking and chip fly can be suppressed and damages to the semiconductor wafer can be suppressed. Moreover, when the curable film is formed of a resin composition containing an epoxy resin, the curable film is restrained or prevented from sticking out at the cut surface when it is cut by dicing. As a result, reattaching (blocking) of two cut surfaces is suppressed or prevented, and the pickup described later can be performed better.

When the laminated film is expanded after the dicing, expanding of the laminated film can be performed using a conventionally known expanding apparatus. The expanding apparatus has a donut-shaped outer ring that can push down the laminated film through a dicing ring and an inner ring having a smaller diameter than the outer ring that supports the laminated film. With this expanding step, two adjacent semiconductor chips can be prevented from contacting to each other and damaged in the pickup step to be described later.

[Pickup Step]

Figure 4C:
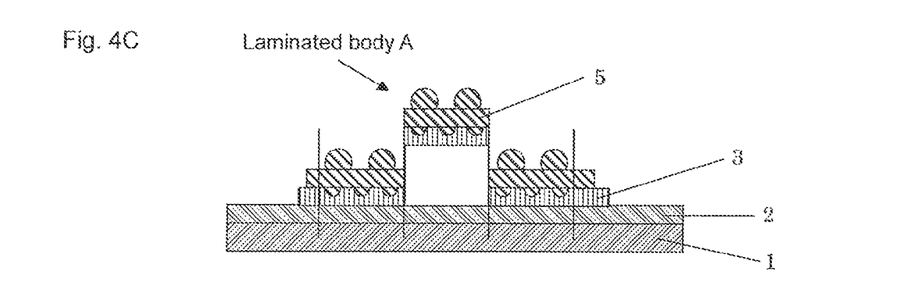

After the pressure-sensitive adhesive layer 2 is cured by irradiating, the semiconductor chip 5 is picked up as shown in FIG. 4C to collect the semiconductor chip 5 that is attached and fixed to the laminated film, and the laminated body A of the semiconductor chip 5 and the curable film 3 is peeled off from the dicing tape (pickup step).

The method of pickup is not especially limited, and various methods that have been conventionally known can be adopted. Examples thereof include a method of pushing up an individual semiconductor chip from the base material side of a laminated film with a needle to pick up the pushed semiconductor chip with a pickup apparatus, and the like. The semiconductor chip 5 that is picked up is integrated with the curable film 3 that is pasted to the first surface 4a to configure the laminated body A.

When the pressure-sensitive adhesive layer 2 is formed with a radiation curable pressure-sensitive adhesive, the pressure-sensitive adhesive layer 2 is cured by radiation irradiation, and then the pickup is preferably performed. The condition of radiation irradiation is not especially limited as long as the pressure-sensitive adhesive layer 2 is cured, and the integrated amount of irradiation may be about 10 to 1000 mJ/cm$^2$ when an ultraviolet ray is radiated for example.

[Step of Flip-Chip Connection]

Figure 4D:
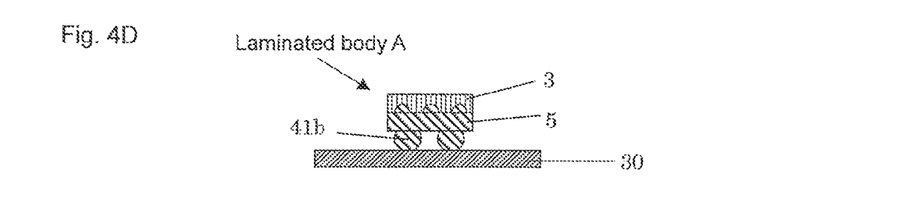

The semiconductor chip (semiconductor element) 5 that is picked up is fixed to an adherend 30 of a substrate or the like with a flip-chip bonding manner (flip-chip mounting manner) (see FIG. 4D). Specifically, the semiconductor chip 5 of the laminated body A is fixed to the adherend 30 in accordance with a normal method in a way that the second surface 4b in the semiconductor chip 5 is facing to the adherend 30. For example, the bump 41b that is formed on the second surface 4b side of the semiconductor chip 5 is allowed to contact to a conductive material such as a solder for bonding that is attached to a connection pad of the adherend 30 and the conductive material is melted while pressing, thereby securing electrical conduction of the semiconductor chip 5 with the adherend 30 and fixing the semiconductor chip 5 to the adherend 30 (flip-chip bonding step). After the semiconductor chip is flip-chip bonded (flip-chip connected) onto the adherend, the surface where the semiconductor chip is facing to the adherend and the space between the semiconductor chip and the adherend are washed, and the space can be sealed by filling it with a sealing material such as a sealing resin.

Various substrates such as a lead frame, and a circuit board such as a wiring circuit board can be used as the adherend 30. The material of the substrate is not especially limited. However, examples thereof include a ceramic substrate and a plastic substrate. Examples of the plastic substrate include an epoxy substrate, a bismaleimide triazine substrate, a polyimide substrate, and a glass epoxy substrate.

In the flip-chip-bonding step, the conductive material is melted, and the bump 41b on the second surface 4b side of the semiconductor chip 5 and the conductive material on the surface of the adherend 30 are connected to each other. The temperature of melting the conductive material is normally about 260° C. (for example, 250 to 300° C.). The laminated film of the present invention has heat resistance that can withstand a high temperature in the flip-chip-bonding step by forming the curable film with an epoxy resin or the like.

The surface at which the semiconductor chip 5 and the adherend 30 face each other (electrode forming surface) and the space are preferably washed in this step. The washing liquid that is used in washing is not especially limited, and examples thereof include an organic washing liquid and an aqueous washing liquid. The curable film of the laminated film of the present invention has solvent resistance to the washing liquid, and does not substantially exhibit solubility in these washing liquids. Accordingly, various washing liquids can be used as described above, and the curable film can be washed by a conventional method without requiring a special washing liquid.

[Step of Three-Dimensional Mounting]

Figure 4E:
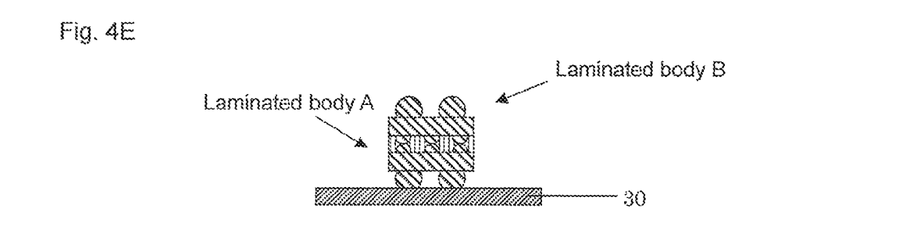

As shown in FIG. 4E, the laminated body A that is fixed to the adherend 30 and the laminated body B are electrically connected in a way that the first surface of the laminated body A and that of the laminated body B that differs from the laminated body A are facing to each other (step of three-dimensional mounting). The laminated body B may be a laminated body that differs from the laminated body A among the laminated bodies that are peeled off in the pickup step, or it may be a laminated body (having a different type of semiconductor element from that of the laminated body A) that is obtained through the same step as in the past steps by separately changing the type of the semiconductor wafer. The same as for the laminated body A, the curable film is pasted to the first surface side of the semiconductor chip (semiconductor element) for the laminated film B. Because the laminated body is connected by the first surfaces to which the curable film is pasted, the space between the semiconductor chips in the laminated body is sufficiently filled with the curable film.

The laminated body A and the laminated body B are electrically connected using a known flip-chip bonder. The flip-chip connection is normally performed under a heated and pressurized condition. Accordingly, the curable film that covers the member for connection becomes soft, the member for connection proceeds by pushing the curable film aside as pressure is applied, and the members for connection of the laminated bodies A and B contact with each other. In general, the temperature of the heating condition is from 240 to 300° C., and the force of the pressurizing condition is from 0.5 to 490 N applied at the flip-chip connection.

After the electrical connection of the laminated body A and the laminated body B is performed, the curable film is cured by heating. Accordingly, since the laminated films are bonded to each other, the surface of the semiconductor element can be protected, and at the same time, the connection reliance between the semiconductor elements can be secured. The heating temperature for curing the curable film is not especially limited, and it may be about from 120 to 200° C.

Next, a sealing step for protecting the entire semiconductor device including semiconductor chips that are three-dimensionally mounted may be performed. The sealing step is performed using a sealing resin. The sealing condition is not especially limited, and thermal curing of the sealing resin is performed normally by heating at 175° C. for 60 to 90 seconds. However, the present invention is not limited thereto, and the resin can be cured at 165 to 185° C. for a few minutes. In the heat treatment in this step, the thermosetting is performed not only on the sealing resin but also on the curable film. Accordingly, curing contraction occurs in both the sealing resin and the curable film as the thermosetting proceeds. As a result, the stress that is applied onto the semiconductor chip as a result of the curing contraction of the sealing resin can be canceled or relaxed by the curing contraction of the curable film. With this step, the curable film can be thermoset completely or almost completely, and the film can be pasted onto the backside of the semiconductor element with excellent adhesion. Further, because the curable film according to the present invention can be thermoset together with the sealing material during the sealing step even when the curable film is in an uncured state, there is no need to add another step for thermosetting the curable film.

The sealing resin is not especially limited as long as it is a resin having an insulation property (an insulating resin), and any material can be used appropriately selected from sealing materials such as known sealing resins. However, an insulating resin having elasticity is more preferable. An example thereof is a resin composition containing an epoxy resin. Examples of the epoxy resin include the epoxy resins described above. In the sealing resin with the resin composition containing an epoxy resin, a thermosetting resin other than the epoxy resin such as a phenol resin, and a thermoplastic resin may be contained as the resin component besides the epoxy resin. The phenol resin can be used also as a curing agent of the epoxy resin, and examples of the phenol resin include the phenol resins described above.

The three-dimensional mounting of the semiconductor element can be performed easily and securely as described above. In addition, the curable film can be further separately pasted to the second surface of the semiconductor wafer between the mounting step and the dicing step. Then, the following steps are performed to produce a laminated body C1 in which the curable films are pasted on both surfaces of the semiconductor element. When the laminated body C1 is used instead of the laminated body B, the curable film is also pasted to the top surface (surface opposite to the laminated body A) of the laminated body C1 that is three-dimensionally mounted onto the laminated body A. Therefore, even when further electrically connecting a laminated body C2 (different from the laminated body C1, the curable films are pasted to both surfaces) to the laminated body C1, the space between the laminated body C1 and the laminated body C2 can be also filled. The above-described procedure can be repeated to perform the three-dimensional mounting in which the semiconductor elements are laminated in a plurality of layers.

(Use of Laminated Film)

The laminated film of the present invention can be used for filling the space between semiconductor elements that are electrically connected through a member or connection as described above. The laminated film can be used in a way that a surface of a semiconductor wafer where a member for connection is formed and a curable film of the laminated film are pasted together; the semiconductor wafer is diced to form semiconductor elements; a laminated body of the curable film and the semiconductor is picked up from the dicing sheet; the laminated bodies are electrically connected through the member for connection and the curable films are bonded to fill the space between the semiconductor elements with the curable film; and the height X (μm) of the member for connection and the thickness Y (μm) of the curable film satisfy the following relationship:

$$1.0 \leq Y/X \leq 1.7.$$

That is to say, a ratio Y:X of the thickness Y (μm) of the curable film to the height X (μm) of the member for connection is preferably within a range of 1.0 to 1.7.

The pasting of the laminated film and the semiconductor wafer, the dicing of the semiconductor wafer, the pickup of the laminated body, the electrical connection of the semiconductor elements, and the bonding of the curable film can be performed in accordance with the procedure of the above-described method of manufacturing a semiconductor device. In the method of manufacturing a semiconductor device, the member for connection such as a bump is formed on both surfaces of the semiconductor wafer. However, the member for connection may be formed on only one surface.

Because the height X (μm) of the member for connection and the thickness Y (μm) of the curable film satisfy the above-described relationship when using the laminated film, the generation of voids between the curable films can be prevented when the semiconductor chips are electrically connected, and at the same time, the curable film can be prevented from protruding from the semiconductor chips.

EXAMPLES

Preferred examples of the present invention will be described in detail below. However, the scope of the invention is not limited to the materials, the compounding amounts, and the like that are described in the examples except otherwise noted. "Parts" means parts by weight.

<Preparation of Base Material>

A polyethylene terephthalate film (PET film) having a thickness of 50 μm was prepared as a base material.

<Production of Dicing Sheet>

(Pressure-Sensitive Adhesive Composition Solution A)

Into a reactor equipped with a cooling tube, a nitrogen gas introduction tube, a thermometer, and a stirrer, 86.4 parts of 2-ethylhexyl acrylate (also referred to as "2EHA" below), 13.6 parts of 2-hydroxylethyl acrylate (also referred to as "HEA" below), 0.2 parts of benzoyl peroxide, and 65 parts of toluene were placed. A polymerization process was performed in a nitrogen gas flow at 61° C. for 6 hours to obtain an acrylic polymer A.

Then, 14.6 parts of 2-methacryloyloxyethylisocyanate (also referred to as "MOI" below) was added to the acrylic polymer A, and an addition reaction process was performed in air flow at 50° C. for 48 hours to obtain an acrylic polymer A'.

Then, 8 parts of a polyisocyanate compound (trade name "Coronate L" manufactured by Nippon Polyurethane Industry Co., Ltd.) and 5 parts of a photopolymerization initiator (trade name "Irgacure 651" manufactured by Chiba Specialty Chemicals Inc.) were added to 100 parts of the acrylic polymer A' to obtain a pressure-sensitive adhesive composition solution A.

In examples and comparative examples, the obtained pressure-sensitive adhesive composition solution A was applied onto the prepared base material described above, dried, and a pressure-sensitive adhesive layer was formed to obtain a dicing sheet. The thickness of the produced pressure-sensitive adhesive layer is as shown in Table 1.

<Production of Curable Film>
(Curable Film A)

31.6 parts of a naphthalene type epoxy resin (product name: HP4032D manufactured by DIC Corporation) having an epoxy equivalent of 142 g/eq, 7.9 parts of a trishydroxyphenylmethane type epoxy resin (product name: EPPN501HY manufactured by Dainippon Ink and Chemicals, Inc.) having an epoxy equivalent of 169 g/eq, 11.8 parts of an aralkyl type phenolic resin (product name: MEHC-7851S manufactured by Meiwa Plastic Industries, Inc.) having a phenolic equivalent of 175 g/eq, 35.5 parts of an aralkyl type phenolic resin (product name: MEHC-7851H manufactured by Meiwa Plastic Industries, Inc.) having a phenolic equivalent of 175 g/eq, 12 parts of a butyl acrylate-acrylonitrile-glycidyl methacrylate copolymer (product name: SG-28GM manufactured by Nagase ChemteX Corporation), and 1 part of triphenylphosphine (manufactured by Shikoku Chemicals Corporation) as a curing catalyst in methylethylketone were dissolved, and 100 parts of an inorganic filler (product name: SE2050MC manufactured by Admatechs Company Limited, average particle size 0.5 μm) was added thereto to prepare a solution of an adhesive composition having a solid concentration of 35% by weight.

This solution of an adhesive composition was applied to a release-treated film including a polyethylene terephthalate film having a thickness of 50 μm on which a silicone release treatment was performed as a peeling liner (separator), and dried at 130° C. for 2 minutes to produce a curable film a having a thickness shown in Table 1.

(Curable Film B)

14.8 parts of a trishydroxyphenylmethane type epoxy resin (product name: EPPN501HY manufactured by DIC Corporation) having an epoxy equivalent of 169 g/eq, 34.4 parts of a bisphenol A type epoxy resin (product name: YL-980 manufactured by Yuka-Shell Epoxy Co., Ltd.) having an epoxy equivalent of 185 g/eq, 22.6 parts of an aralkyl type phenolic resin (product name: MEHC-7851S manufactured by Meiwa Plastic Industries, Inc.) having a phenolic equivalent of 175 g/eq, 15.1 parts of a phenol novolac resin (product name: GS-180 manufactured by Gunei Chemical Industry Co., Ltd.) having an phenolic equivalent of 105 g/eq, 12 parts of a butyl acrylate-acrylonitrile-ethyl acrylate copolymer (product name: SG-P3 manufactured by Nagase ChemteX Corporation), and 1 part of triphenylphosphine (manufactured by Shikoku Chemicals Corporation) as a curing catalyst in methylethylketone were dissolved, and 100 parts of an inorganic filler (product name: SE2050MC manufactured by Admatechs Company Limited, average particle size 0.5 μm) was added thereto to prepare a solution of an adhesive composition having a solid concentration of 40% by weight.

This solution of an adhesive composition was applied to a release-treated film including a polyethylene terephthalate film having a thickness of 50 μm on which a silicone release treatment was performed as a peeling liner (separator), and dried at 130° C. for 2 minutes to produce a curable film b having a thickness shown in Table 1.

(Curable Film C)

5 parts of a bisphenol A type epoxy resin (product name: YL-980 manufactured by Yuka-Shell Epoxy Co., Ltd.) having an epoxy equivalent of 185 g/eq, 15 parts of a cresol novolac type epoxy resin (product name: KI-3000-4 manufactured by Tohto Kasei Co., Ltd.) having an epoxy equivalent of 198 g/eq, 22.3 parts of an aralkyl type phenolic resin (product name: MEHC-7851H manufactured by Meiwa Plastic Industries, Inc.) having a phenolic equivalent of 175 g/eq, 146 parts of a butyl acrylate-acrylonitrile-ethyl acrylate copolymer (product name: SG-70L manufactured by Nagase ChemteX Corporation), and 1 part of triphenylphosphine (manufactured by Shikoku Chemicals Corporation) as a curing catalyst in methylethylketone were dissolved, and 71 parts of an inorganic filler (product name: SE2050MC manufactured by Admatechs Company Limited, average particle size 0.5 μm) was added thereto to prepare a solution of an adhesive composition having a solid concentration of 41% by weight.

This solution of an adhesive composition was applied to a release-treated film including a polyethylene terephthalate film having a thickness of 50 μm on which a silicone release treatment was performed as a peeling liner (separator), and dried at 130° C. for 2 minutes to produce a curable film c having a thickness shown in Table 1.

(Curable Film D)

5 parts of a bisphenol A type epoxy resin (product name: YL-980 manufactured by Yuka-Shell Epoxy Co., Ltd.) having an epoxy equivalent of 185 g/eq, 15 parts of a cresol novolac type epoxy resin (product name: KI-3000-4 manufactured by Tohto Kasei Co., Ltd.) having an epoxy equivalent of 198 g/eq, 22.3 parts of an aralkyl type phenolic resin (product name: MEHC-7851H manufactured by Meiwa Plastic Industries, Inc.) having a phenolic equivalent of 175 g/eq, 124.4 parts of a butyl acrylate-acrylonitrile-ethyl acrylate copolymer (product name: SG-70L manufactured by Nagase ChemteX Corporation), and 1 part of triphenylphosphine (manufactured by Shikoku Chemicals Corporation) as a curing catalyst in methylethylketone were dissolved, and 124.4 parts of an inorganic filler (product name: SE2050MC manufactured by Admatechs Company Limited, average particle size 0.5 μm) was added thereto to prepare a solution of an adhesive composition having a solid concentration of 34% by weight.

This solution of an adhesive composition was applied to a release-treated film including a polyethylene terephthalate film having a thickness of 50 μm on which a silicone release treatment was performed as a peeling liner (separator), and dried at 130° C. for 2 minutes to produce a curable film d having a thickness shown in Table 1.

(Curable Film E)

5 parts of a bisphenol A type epoxy resin (product name: YL-980 manufactured by Yuka-Shell Epoxy Co., Ltd.) having an epoxy equivalent of 185 g/eq, 15 parts of a cresol novolac type epoxy resin (product name: KI-3000-4 manufactured by Tohto Kasei Co., Ltd.) having an epoxy equivalent of 198 g/eq, 22.3 parts of an aralkyl type phenolic resin (product name: MEHC-7851H manufactured by Meiwa Plastic Industries, Inc.) having an phenolic equivalent of 175 g/eq, 342 parts of a butyl acrylate-acrylonitrile-ethyl acrylate copolymer (product name: SG-70L manufactured by Nagase ChemteX Corporation), and 1 part of triphenylphosphine (manufactured by Shikoku Chemicals Corporation) as a curing catalyst in methylethylketone were dissolved, and 149.5 parts of an inorganic filler (product name: SE2050MC manufactured by Admatechs Company Limited, average particle size 0.5 µm) was added thereto to prepare a solution of an adhesive composition having a solid concentration of 32% by weight.

This solution of an adhesive composition was applied to a release-treated film including a polyethylene terephthalate film having a thickness of 50 µm on which a silicone release treatment was performed as a peeling liner (separator), and dried at 130° C. for 2 minutes to produce a curable film e having a thickness shown in Table 1.

<Production of Laminated Film>

Each of the curable films was transferred onto the pressure-sensitive adhesive layer of the above-described dicing sheet to obtain a laminated film. The lamination conditions are as follows.

<Lamination Conditions>
Laminator: roll laminator
Lamination rate: 1 mm/minute
Lamination pressure: 0.5 MPa
Laminator temperature: room temperature (23° C.)

(Measurement of Lowest Melt Viscosity)

The lowest melt viscosity of the curable film (before thermal curing) was measured. The lowest melt viscosity is a value that is measured using a rheometer (RS-1 manufactured by HAAKE) in accordance with a parallel plate method. In more detail, the melt viscosity was measured in a range of from 50 to 200° C. under conditions of a gap of 100 µm, a diameter in a rotating cone of 20 mm, and a rotation rate of 10 $s^{-1}$, and the lowest value of the obtained melt viscosities was determined as the lowest melt viscosity. The results are shown in Table 1.

(Measurement of Peeling Strength of Pressure-Sensitive Adhesive Layer and Curable Film)

A silicon wafer with bumps on one surface in which bumps were formed on one surface was prepared, and the laminated films of examples and comparative examples were pasted to the surface of the silicon wafer with bumps on one surface, in which bumps were formed, allowing the curable film to be a pasting surface. The following wafer was used as the silicon wafer with bumps on one surface. The pasting conditions are as follows. The ratio (Y/X) of the thickness Y (µm) of the curable film to the height X (µm) of the member for connection is also shown in Table 1.

<Silicon Wafer with Bumps on One Surface>
Thickness of silicon wafer: 200 µm
Material of low dielectric material layer (bump side surface): SiN film
Thickness of low dielectric material layer: 0.3 µm
Height of bump: 60 µm
Pitch of bump: 150 µm
Material of bump: solder <Pasting Condition>
Pasting apparatus: DR-3000II manufactured by Nitta Seiki Co., Ltd.
Lamination rate: 0.1 mm/minute
Lamination pressure: 0.5 MPa
Laminator temperature: 75° C.

Then, the peeling strength between the pressure-sensitive adhesive layer and the curable film was measured. First, the pressure-sensitive adhesive layer was irradiated with an ultraviolet ray from the base material side to cure the pressure-sensitive adhesive layer. For irradiation with an ultraviolet ray, an ultraviolet ray irradiation apparatus (product name: UM810, manufacturer: Nitto Seiki Co., Ltd.) was used and the ultraviolet ray radiation amount was set to be 400 mJ/cm². After that, the peeling strength (N/20 mm) of the pressure-sensitive adhesive layer and the curable film was measured. Specifically, a T-type peeling test (JIS K6854-3) as a tensile test was performed under conditions of a temperature of 23±2° C., a peeling angle of 180°, a peeling rate of 300 mm/minute, and a distance between chucks of 100 mm using trade name "Auto Graph AGS-H" manufactured by SHIMADZU CORPORATION. The results are shown in Table 1 as "Peeling Strength of Pressure-Sensitive Adhesive Layer and Curable Film after Irradiation with Ultraviolet Radiation."

(Pickup Property)

The dicing of each of the silicon wafers with bumps on one surface and the silicon wafer with bumps on both surfaces was independently performed using the above-described laminated film with the following procedure. Then, the pickup performance was evaluated for each laminated film.

The silicon wafer with bumps on one surface and the laminated film were pasted to each other according to the procedure of the above-described peeling strength evaluation to perform dicing in the following conditions. In dicing, the wafer was full-cut to obtain a chip of 10 mm square. For the silicon wafer with bumps on both surfaces, any of the surfaces and the laminated film were pasted to each other to perform the same procedure as described above. The following wafer was used as the silicon wafer with bumps on both surfaces.

<Silicon Wafer with Bumps on Both Surfaces>
Thickness of silicon wafer: 200 µm
Material of low dielectric material layer (both surfaces): SiN film
Thickness of low dielectric material layer: 0.3 µm
Height of bump: 60 µm
Pitch of bump: 150 µm
Material of bump: solder <Dicing Conditions>
Dicing apparatus: trade name "DFD-6361" manufactured by DISCO Corporation
Dicing ring: "2-8-1" manufactured by DISCO Corporation
Dicing rate: 30 mm/second
Dicing blade:
Z1-axis: "2030-SE 27HCDD" manufactured by DISCO Corporation
Z2-axis: "2030-SE 27HCBB" manufactured by DISCO Corporation Rotation number of dicing blade:
Z1-axis: 40,000 rpm
Z2-axis: 45,000 rpm
Cutting manner: Step cut
Wafer chip size: 10 mm square Then, the pressure-sensitive adhesive layer was cured by an ultraviolet ray in the ultraviolet irradiation conditions in the above-described procedure of measuring the peeling strength. After that, the laminated body of the curable film and the semiconductor chip with bumps on one surface (one surface bump) and the laminated body of the curable film and the semiconductor chip with bumps on both surfaces (both surface bump) were picked up with a manner of pushing a needle from the base material side of each dicing film. The pickup conditions are as follows. The evaluation was performed by marking "Good" for a case where any inferior pickup did not occur and "Poor" for a case where inferior pickup occurred even once when 100 pieces of the laminated bodies were picked up. The results are shown in Table 1.

<Pickup Conditions>
Die bonding apparatus: apparatus name: SPA-300 manufactured by Shinkawa Ltd.
Number of needles: 9 needles
Needle pushing distance: 350 μm (0.35 mm)
Needle pushing rate: 5 mm/second
Adsorption maintaining time: 80 ms
<Evaluations of Film Bonding Property when Bonding Semiconductor Chip with Curable Film, Presence or Absence of Generation of Voids Between Films, and Protrusion of Film>

A pair of the laminated bodies (bumps on one surface) that were picked up with the procedure described in the evaluation of the pickup property were bonded together so that the curable films were facing each other. Similarly, a pair of the laminated bodies (bumps on both surfaces) was bonded together. As the bonding conditions, the bonding temperature was 260° C., the bonding pressure was 20 N, and the pressure loading time was 5 seconds. At this time, the evaluation was performed by marking "Good" for a case where the curable films were able to be bonded (attached) to each other and "Poor" for a case where they were not able to be bonded. The presence or absence of generation of voids between the curable films upon bonding was observed using an ultrasonic image apparatus FS200II manufactured by Hitachi Kenki Fine Tech Co., Ltd. The evaluation was performed by marking "Good" for a case where voids were not generated and "Poor" for a case where voids were generated. Further, whether or not the curable film protruded from the space between the semiconductor chips upon bonding was observed using an optical microscope (magnification: 40×). The evaluation was performed by marking "Good" for a case where there was no protrusion or the protruding portion did not reach the surface opposite to the surface of the semiconductor chip bonding side even if it protruded and "Poor" for a case where the protruding portion reached the surface opposite to the surface of the semiconductor chip bonding side. Each result is shown in Table 1.

As seen from Table 1, in the laminated films according to the examples, the peeling strength between the pressure-sensitive adhesive layer and the curable film was small and the pickup property was good. The bonding property of the curable films when bonding the semiconductor chips through the curable films interposed therebetween was good, there was no generation of voids between the curable films, and the protrusion of the curable films from between the semiconductor chips was suppressed. On the other hand, in the laminated film of Comparative Example 1, the curable films were not bonded together because the lowest melt viscosity of the curable film was too high, exceeding $1\times10^4$ Pa·s. In contrast, in the laminated film of Comparative Example 2, voids were generated between the curable films upon bonding and the curable film protruded because the lowest melt viscosity of the curable film was too low, being less than $1\times10^2$ Pa·s. In the laminated film of Comparative Example 3, the curable films were not bonded together because the value of the thickness of the curable film was too small compared to the value of the height of the bump, and as a result, the space between the semiconductor chips was not able to be filled. In the laminated film of Comparative Example 4, the curable films protruded because the value of the thickness of the curable film was too large compared to the value of the height of the bump although the space between the semiconductor chips was able to be filled. It can be seen from the results of Comparative Examples 3 and 4 that the ratio (Y/X) of the thickness Y (μm) of the curable film to the height X (μm) of the bump (member for connection) is preferably 1.0 or more and 1.7 or less when three-dimensionally mounting the semiconductor chips using the laminated film of the present invention. It can be concluded that the above-mentioned points apply to both of a chip with bumps on one surface and a chip with bumps on both surfaces.

TABLE 1

| | | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Base Material | Material | PET | PET | PET | PET | PET | PET | PET | PET | PET |
| | Thickness (μm) | 50 | 50 | 50 | 50 | 50 | 50 | 50 | 50 | 50 |
| Pressure-Sensitive Adhesive Layer | Type of Pressure-Sensitive Adhesive Composition | A | A | A | A | A | A | A | A | A |
| | Thickness (μm) | 30 | 30 | 30 | 30 | 30 | 30 | 30 | 30 | 30 |
| Curable Film | Type of Curable Film | a | c | d | a | a | e | b | a | a |
| | Thickness (μm) | 70 | 70 | 70 | 100 | 70 | 70 | 70 | 40 | 120 |
| | Ratio (Y/X) of Thickness Y (μm) of Curable Film to Height X (μm) of Bump | 1.2 | 1.2 | 1.2 | 1.7 | 1.2 | 1.2 | 1.2 | 0.7 | 2.0 |
| | Lowest Melt Viscosity (Pa·s) of Curable Film | $1.0 \times 10^2$ | $2.8 \times 10^3$ | $7.0 \times 10^3$ | $1.0 \times 10^2$ | $1.0 \times 10^2$ | $5.1 \times 10^4$ | $4.1 \times 10$ | $1.0 \times 10^2$ | $1.0 \times 10^2$ |
| Peeling Strength (N/20 mm) of Pressure-Sensitive Adhesive Layer and Curable Film after Irradiation with Ultraviolet Radiation | | 0.04 | 0.04 | 0.04 | 0.04 | 0.04 | 0.04 | 0.04 | 0.04 | 0.04 |
| Evaluation of Chip with Bumps on One Surface | Pickup Property | Good | Good | Good | Good | Good | Good | Good | Good | Good |
| | Bonding Property | Good | Good | Good | Good | Good | Poor | Good | Poor | Good |
| | Filling of Voids between Curable Films upon Bonding Chips | Good | Good | Good | Good | Good | Good | Poor | Poor | Good |
| | Protrusion of Curable Film upon Bonding Chips | Good | Good | Good | Good | Good | Good | Poor | Good | Poor |
| Evaluation of Chip with Bumps on Both Surfaces | Pickup Property | Good | Good | Good | Good | Good | Good | Good | Good | Good |
| | Bonding Property | Good | Good | Good | Good | Good | Poor | Good | Poor | Good |
| | Voids between Curable Films upon Bonding Chips | Good | Good | Good | Good | Good | Good | Poor | Poor | Good |
| | Protrusion of Curable Film upon Bonding Chips | Good | Good | Good | Good | Good | Good | Poor | Good | Poor |

It should be understood that the embodiments herein are illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A laminated film for filling a space between semiconductor elements that are electrically connected through a member for connection, the film comprising a dicing sheet in which a pressure-sensitive adhesive layer is laminated on a base material, and a curable film that is laminated on the pressure-sensitive adhesive layer, wherein:

the curable film is configured to be peeled from the pressure-sensitive adhesive layer of dicing sheet;

the curable film has a lowest melt viscosity at 50 to 200° C. of $1\times10^2$ Pa·s to $1\times10^4$ Pa·s; and a height X (µm) of the member for connection and a thickness Y (µm) of the curable film satisfy the following relationship:

$$1.0 \leq Y/X \leq 1.7.$$

2. The laminated film according to claim 1, wherein the curable film comprises an adhesive composition containing an epoxy resin and a phenolic resin.

3. The laminated film according to claim 2, wherein the adhesive composition further contains an acrylic copolymer.

* * * * *